(12) United States Patent
Gates et al.

(10) Patent No.: US 6,710,450 B2
(45) Date of Patent: Mar. 23, 2004

(54) INTERCONNECT STRUCTURE WITH PRECISE CONDUCTOR RESISTANCE AND METHOD TO FORM SAME

(75) Inventors: Stephen McConnell Gates, Ossining, NY (US); Jeffrey Curtis Hedrick, Montvale, NJ (US); Satyanarayana V. Nitta, Poughquag, NY (US); Sampath Purushothaman, Yorktown Heights, NY (US); Cristy Sensenich Tyberg, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/795,430

(22) Filed: Feb. 28, 2001

(65) Prior Publication Data

US 2002/0117737 A1 Aug. 29, 2002

(51) Int. Cl.$^7$ .................. H01L 23/532; H01L 23/522
(52) U.S. Cl. ............... 257/759; 257/750; 257/758; 257/760
(58) Field of Search ........................ 257/700–701, 257/741, 750–751, 754–756, 758–760, 762–765, 767, 770–771, 774, E21.382, E29.027, E29.066

(56) References Cited

U.S. PATENT DOCUMENTS

| | | | | |
|---|---|---|---|---|
| 5,962,581 A | * | 10/1999 | Hayase et al. | 524/588 |
| 5,976,710 A | * | 11/1999 | Sachdev et al. | 428/620 |
| 6,071,809 A | | 6/2000 | Zhao | |
| 6,184,284 B1 | * | 2/2001 | Stokich, Jr. et al. | 524/500 |
| 6,265,780 B1 | * | 7/2001 | Yew et al. | 257/759 |
| 6,316,833 B1 | * | 11/2001 | Oda | 257/758 |
| 6,340,435 B1 | * | 1/2002 | Bjorkman et al. | 216/72 |

OTHER PUBLICATIONS

S. Wolf and R.N. Tauber, "Silicon Processing for the VLSI Era", vol. 1— Process Technology, Second Edition, pp. 799–801; published by Lattice Press, Sunset Beach, California, USA (published in 2000).*

Hasegawa, T., et al., "Copper Dual Damascene Interconnects with Low–K (Keff <3.0) Dielectrics Using FLARETM and an Organo–Silicate Hard Mask", IEEE, (1999) pp. 26.4.1–26.4.4.

Goldblatt, R.D., et al., "A High Performance 0.13 $\mu$m Copper BEOL Technology with Low–k Dielectric", Proceedings of 2000 IITC, IEEE, (2000).

Takao, Y., et al., "A 0.11 $\mu$m CMOS Technology with Copper and Very–low–k Interconnects for High–Performance System–On–a Chip Cores", IEEE, (2000) pp. 23.1.1–23.1.4.

* cited by examiner

Primary Examiner—Minhloan Tran
Assistant Examiner—Johannes Mondt
(74) Attorney, Agent, or Firm—Scully, Scott, Murphy & Presser; Daniel P. Morris

(57) ABSTRACT

An interconnect structure including a patterned multilayer of spun-on dielectrics as well as methods for manufacturing the same are provided. The interconnect structure includes a patterned multilayer of spun-on dielectrics formed on a surface of a substrate. The patterned multilayer of spun-on dielectrics is composed of a bottom low-k dielectric, a buried etch stop layer, and a top low-k dielectric, wherein the bottom and top low-k dielectrics have a first composition, the said buried etch stop layer has a second composition which is different from the first composition and the buried etch stop layer is covalently bonded to said top and bottom low-k dielectrics. The interconnect structure further includes a polish stop layer formed on the patterned multilayer of spun-on dielectrics; and metal conductive regions formed within the patterned multilayer of spun-on dielectrics. Covalent bonding is achieved by employing an organosilane having functional groups that are capable of bonding with the top and bottom dielectric layers.

18 Claims, 4 Drawing Sheets

INTERCONNECT STRUCTURE WITH PRECISE CONDUCTOR RESISTANCE AND METHOD TO FORM SAME

FIELD OF THE INVENTION

The present invention relates to interconnect structures for high-speed microprocessors, application specific integrated circuits (AISCs), and other high-speed integrated circuits (ICs). The present invention provides low dielectric constant (i.e., low-k) interconnect structures having enhanced circuit speed, precise values of conductor resistance, and reduced fabrication cost. Moreover, the structures of the present invention have a lower effective dielectric constant and improved control over metal line resistance as compared with prior art interconnect structures.

BACKGROUND OF THE INVENTION

Many low-k (on the order of about 3.5 or less) plus Cu interconnect structures of the dual damascene-type are known; See, for example, R. D. Goldblatt, et al., "A High Performance 0.13 μm Copper BEOL Technology with Low-K Dielectric", Proceedings of the International Interconnect Technology Conference, IEEE Electron Devices Society, Jun. 5–7, 2000, pgs 261–263. Such prior art interconnect structures include inorganic as well as organic dielectric materials as the interlevel or intralevel dielectric. It is widely accepted that dual-damascene structures are lower cost than single damascene or subtractive metal structures.

Typically, there are four essential problems associated with prior art dual damascene interconnect structures which include the following:

(i) Poor control over Cu line thickness (i.e., trench depth) and resistivity.

(ii) High coefficient of thermal expansion (CTE) of low-k dielectrics, which may eventually lead to failure during thermal cycling.

(iii) The inability of low-k dielectrics to survive chemical-mechanical polishing (CMP).

(iv) Increased cost to fabricate the structures.

During fabrication of prior art interconnect structures, the depth of the trenches that become the metal line conductors (after metal fill and CMP) is often poorly controlled, and the trench bottom has a rough surface. This effect is exacerbated when performing reactive-ion etching (RIE) on porous dielectrics. A timed reactive-ion etching (RIE) process is typically used to etch the trenches, with time controlling the trench depth. Variations in the etch rate with feature size (trench width) from day to day, and across the wafer, lead to large variations in the trench depth which, in turn, leads to large variations in the metal conductor resistance. Roughness at the trench bottom leads to higher capacitance, leaky electron current between metal levels, cross-talk, noise, power dissipation and ultimately, to poorer device performance and poorer reliability.

Common solutions to the aforementioned problems add extra processing steps, including deposition of a discrete etch stop layer in a separate plasma-enhanced chemical vapor deposition (PECVD) tool, thus raising the cost of fabricating the desired low-k plus Cu interconnect structure.

Additionally, low-k dielectrics plus Cu interconnect structures of the dual damascene-type fail during thermal cycling tests due to a high-CTE of the dielectric surrounding the vias. Moreover, commonly used porous low-k dielectrics do not survive CMP. Instead, prior art porous low-k dielectrics tend to delaminate and be removed during the CMP process. Furthermore, prior art etch stop layers are made from vacuum-based PECVD deposition tools that are costly to purchase and maintain. p In view of the above problems in the prior art, there is a continued need for providing new and improved low-k dielectrics which can be used in interconnect structures of the dual damascene-type that overcome the drawbacks mentioned above.

SUMMARY OF THE INVENTION

One object of the present invention is to provide an interconnect structure of the dual damascene-type comprising a multilayer low-k dielectric stack and metal conductor in which precise and uniform control over the metal conductor resistance is obtained.

Another object of the present invention is to provide an interconnect structure in which a spun-on buried etch stop layer is provided between spun-on dielectrics of a multilayer low-k dielectric stack.

A further object of the present invention is to provide an interconnect structure in which the buried etch stop layer of a multilayer low-k dielectric stack will react and form covalent bonds between a bottom spun-on low-k dielectric and a top spun-on low-k dielectric of the multilayer dielectric stack.

An even further object of the present invention is to provide an interconnect structure in which the buried etch stop layer also functions to improve the adhesion between a bottom spun-on low-k dielectric and a top spun-on low-k dielectric of the multilayer dielectric stack, thereby eliminating the need of an additional adhesion promoter.

A yet further object of the present invention is to provide precise control over the metal conductor resistance of an interconnect structure without adding additional processing steps and cost.

An additional object of the present invention is to provide an interconnect structure which comprises a multilayer of low-k dielectrics which are formed by spin coating thereby reducing the use of costly vacuum-based deposition tools.

These and other objects and advantages are achieved in the present invention by utilizing a buried etch stop layer with a multilayer low-k dielectric stack which is capable of chemically bonding to both the bottom and top low-k spun-on dielectric layers through incorporation of a functional organosilane containing groups that are capable of covalently bonding with the dielectrics of the multilayer low-k dielectric stack.

Specifically, the interconnect structure of the present invention comprises:

a substrate having a patterned multilayer of spun-on dielectrics formed on a surface thereof, said patterned multilayer of spun-on dielectrics comprising a bottom low-k dielectric, a buried etch stop layer, and a top low-k dielectric, wherein said bottom and top low-k dielectrics have a first composition, and said buried etch stop layer has a second composition which is different from said first composition and said buried etch stop layer is covalently bonded to said top and bottom low-k dielectrics;

a polish stop layer formed on said patterned multilayer of spun-on dielectrics; and metal conductive regions formed within said patterned multilayer of spun-on dielectrics.

The present invention also provides a multilayer spun-on dielectric which comprises a bottom low-k dielectric, a buried etch stop layer, and a top low-k dielectric, wherein said bottom and top low-k dielectrics have a first composition, and said buried etch stop layer has a second composition which is different from said first composition and said buried etch stop layer is covalently bonded to said top and bottom low-k dielectrics.

Another aspect of the present invention comprises a method of forming the aforementioned interconnect structure. Specifically, the inventive method comprises the steps of:

(a) forming a multilayer of spun-on dielectrics on a surface of a substrate, said multilayer of spun-on dielectrics comprising a bottom low-k dielectric, a buried etch stop layer, and a top low-k dielectric, wherein said bottom and top low-k dielectrics have a first composition, and said buried etch stop layer has a second composition which is different from said first composition and said buried etch stop layer is capable of covalently bonding to said top and bottom low-k dielectrics in a subsequent curing step;

(b) curing said multilayer of spun-on dielectrics, wherein during said curing said buried etch stop layer covalently bonds to said top and bottom low-k dielectrics, while undergoing crosslinking;

(c) forming a hard mask on said cured multilayer of spun-on dielectrics, said hard mask including at least a polish stop layer;

(d) forming an opening in said hard mask so as to expose a portion of said multilayer of spun-on dielectrics;

(e) forming a trench in said exposed portion of said multilayer of spun-on dielectrics;

(f) filling said trench with at least a conductive metal; and (g) planarizing said conductive metal stopping on said polish stop layer.

It is noted that the method described above relates to an embodiment of the present invention wherein the hard mask is formed by deposition processing other than spin-on coating. When the hard mask is formed by spin-on coating, the method of the present invention includes the steps of:

(a) forming a multilayer of spun-on dielectrics on a surface of a substrate, said multilayer of spun-on dielectrics comprising a bottom low-k dielectric, a buried etch stop layer, and a top low-k dielectric, wherein said bottom and top low-k dielectrics have a first composition, and said buried etch stop layer has a second composition which is different from said first composition and said buried etch stop layer is capable of covalently bonding to said top and bottom low-k dielectrics in a subsequent curing step;

(b) forming a hard mask on said multilayer of spun-on dielectrics, said hard mask including at least a polish stop layer;

(c) curing said hard mask and said multilayer of spun-on dielectrics, wherein during said curing said buried etch stop layer covalently bonds to said top and bottom low-k dielectrics, while undergoing crosslinking;

(d) forming an opening in said hard mask so as to expose a portion of said multilayer of spun-on dielectrics;

(e) forming a trench in said exposed portion of said multilayer of spun-on dielectrics;

(f) filling said trench with at least a conductive metal; and (g) planarizing said conductive metal stopping on said polish stop layer.

It is noted that the above method is preferred over the previously mentioned method since a single spin coating tool can be used for forming the various layers of the multilayer of spun-on dielectrics and the hard mask.

DETAILED DESCRIPTION OF THE INVENTION

Figure 1A:
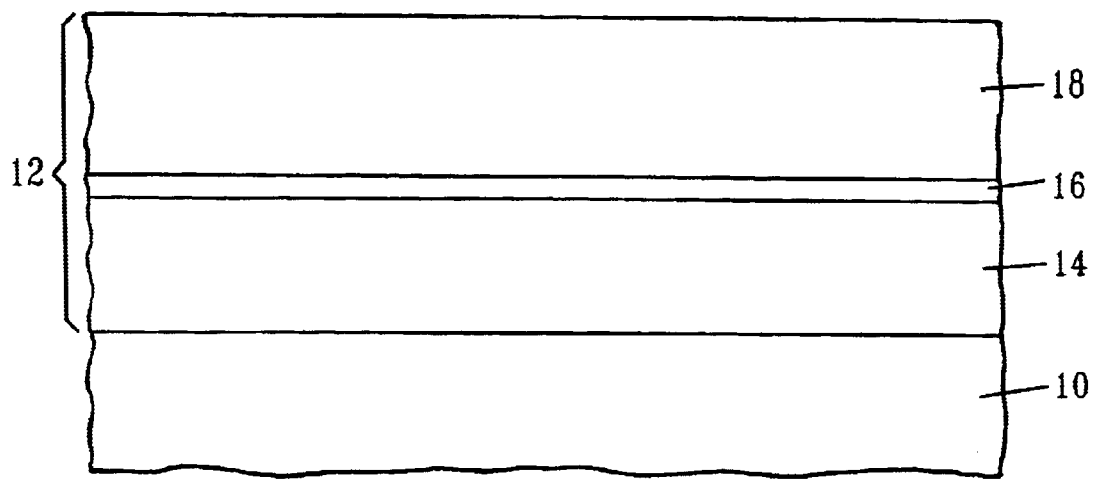
FIGS. 1A–1G are cross-sectional views of the inventive interconnect structure through preferred processing steps of the present invention, i.e., wherein the multilayer of spun-on dielectrics and the hard mask are both formed by spin coating.

The present invention which provides a multilayer of spun-on dielectrics which includes at least a buried etch stop layer that is capable of covalently bonding to bottom and top spun-on dielectrics of said multilayer will now be described in more detail by referring to the drawings of the present invention. It is noted that in the drawings that accompany the present application, like and corresponding elements are referred to by like and corresponding reference numerals.

Reference is first made to FIG. 1A which illustrates an initial structure that is employed in the present invention. Specifically, the structure shown in FIG. 1A comprises substrate 10 having a multilayer of spun-on dielectrics 12 formed on a surface thereof. The multilayer of spun-on dielectrics employed in the present invention has an effective dielectric constant of about 3.5 or less, with an effective dielectric constant of from about 1.4 to about 3.0 being more preferred. In accordance with the present invention, multilayer of spun-on dielectrics includes bottom low-k dielectric 14, buried etch stop layer 16 and top low-k dielectric 18.

The multilayer of spun-on dielectrics employed in the present invention includes top and bottom spun-on low-k dielectrics (on the order of about 3.5 or less) that have a first composition and a buried etch stop layer that has a second composition that is different from the first. It is noted that the bottom spun-on dielectric of the multilayer serves as the via level of the interconnect structure, whereas top spun-on dielectric serves as the line level of the interconnect structure. The buried etch stop layer serves dual functions in the present invention. First, it functions as a normal etch stop layer, and secondly it provides for improved adhesion between the top and bottom spun-on dielectrics.

The buried etch stop layer of the present invention, which will be described in more detail below, is made of a material which is capable of forming covalent bonds between the top and bottom spun-on dielectrics. The covalent bonding is achieved by utilizing a functional organosilane that includes functional groups capable of bonding with the spun-on dielectric layers. The organosilane buried etch stop layer as well as the other elements that comprise the inventive interconnect structure will now be described in greater detail.

Substrate 10 employed in the present invention may include any conventional material that is typically present in an interconnect structure. Thus, for example, substrate 10 may be a dielectric (interlevel or intralevel), a wiring level, an adhesion promoter, a semiconductor wafer or any combinations thereof. When a semiconductor wafer is employed as the substrate, the wafer may include various circuits and/or devices formed thereon.

Multilayer spun-on dielectric 12 is then formed on a surface of substrate 10 utilizing conventional spin-on coating processing steps that are well known to those skilled in the art, and following the spin-on process each layer is subjected to a hot plate bake process which is carried out using conditions that are sufficient to remove any residual solvent from the spun-on dielectric layer, and partially crosslink the dielectric layer.

The bottom and top spun-on dielectrics of the multilayer dielectric structure are composed of the same or different low-k organic or inorganic dielectric. The term low-k is used herein to denote a dielectric constant of from about 1.1 to about 3.5, with a dielectric constant of from about 1.4 to about 3.0 being more preferred. When an organic low-k dielectric is employed, the organic dielectric includes compounds comprising C, O and H. Examples of organic low-k dielectrics that can be employed in the present invention include, but are not limited to: aromatic thermosetting polymeric resins, for example, resins sold by Dow Chemical Company under the tradename SiLK®, Honeywell under the tradename Flare®, and similar resins from other suppliers and other like organic dielectrics. It is noted that the organic dielectric employed in the present invention may, or may not be porous. When porous low-k organic dielectrics are employed, the pore size of the porous organic dielectrics may vary, but typically organic dielectrics having a pore size of from about 1 to about 50 nm at a volume percent porosity of from about 5 to about 35% are employed. Also, the bottom dielectric (via level) may be non-porous and the top dielectric (line level) may be porous.

When the bottom and top low-k spun-on dielectrics are formed of an inorganic dielectric layer, the inorganic dielectric layer typically comprises Si, O and H, and optionally C. An example of one type of inorganic dielectric that can be employed in the present invention is the silsesquioxane HOSP (Si-containing inorganic dielectric sold by Honeywell). Other types of inorganic dielectrics that may be employed in the present invention include, but are not limited to: methylsilsesquioxane (MSQ), tetraethylorthosilane (TEOS), hydrido silsesquioxane (HSQ), MSQ-HSQ, organosilanes and any other Si-containing material. The present invention contemplates the use of porous or non-porous inorganic dielectrics. While the pore size of the inorganic spun-on dielectric is not critical to the present invention, the pore size of the inorganic spun-on dielectric employed in the present invention is typically of from about 5 to about 500 Å at a volume percent porosity of from about 5 to about 80%, with a pore size of from about 10 to about 200 Å at a volume percent porosity of from about 10 to about 50% being more highly preferred.

In one embodiment of the present invention, it is highly preferred to employ organic dielectrics as both top and bottom layers of the multilayer structure. In that embodiment, a porous organic top dielectric is most preferably employed.

In another embodiment of the present invention, the top and bottom spun-on dielectrics are composed of inorganic dielectrics (porous or not porous). In yet another embodiment of the present invention, an organic dielectric is employed as the top low-k dielectric and an inorganic dielectric is employed as the bottom low-k dielectric. Alternatively, an organic dielectric is employed as the bottom low-k dielectric and an inorganic dielectric is employed as the top low-k dielectric.

The multilayer of spun-on dielectrics employed in the present invention also includes a buried etch stop layer that is sandwiched between the bottom and top low-k dielectrics. The buried etch stop layer employed in the present invention is formed utilizing conventional spin coating processes that are well known to those skilled in the art. In accordance with the present invention, the buried etch stop layer is composed of a material that is capable of forming covalent bonds to the bottom and top low-k dielectrics upon a subsequent curing step. It is noted that the buried etch stop layer also functions to improve the adhesion between the top and bottom low-k dielectrics. Specifically, the buried etch stop layer employed in the present invention comprises an organosilane having the formula:

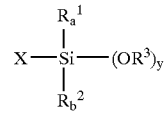

wherein X is a polymerizable group capable of undergoing a Diels-Alder reaction or a free radical reaction and is selected from alkenes, norborenylenes, vinyl and alkynes; $R^1$ and $R^2$ are the same or different and are H, alkyl, alkoxy, alkylester, alkenyl, alkynyl, aryl, or cycloalkyl; $R^3$ is alkyl or a $—C(O)R^4$ radical wherein $R^4$ is alkyl; a and b are the same or different and are 0, 1 or 2, and y is from 1–3, with the proviso that the sum of a+b+y is 3.

Various alkoxysilanes may be employed in the present invention, such as vinyltrialkoxysilane, allyltrialkoxysilane, vinyldiphenylalkoxysilane, norborenyltrialkoxysilane, and trivinyltrialkoxysilane. Some specific examples include vinyltriacetoxysilane, vinyltrimethoxysilane, vinyltriethoxysilane, allyltrimethoxysilane, vinyldiphenylethoxysilane, norborenyltriethoxysilane and trivinyltriethoxysilane. Of the various alkoxysilanes that may be employed in the present invention, vinyltrialkoxysilanes such as vinyltriacetoxysilane, vinyltrimethoxysilane and vinyldiphenylethoxysilane are preferred. Of these vinyltrialkoxysilanes, vinyltriacetoxysilane is most particularly preferred.

Without wishing to be bound by any theory, it is believed that during a subsequent curing step, the spun-on organosilane first undergoes a hydrolysis reaction wherein the R groups are removed from the organosilane, and then the $XSi(OH)_3$ group undergoes a homopolymerization or (condensation reaction) which forms an $SiO_{1.5}X$ network. The X groups can also undergo either a free radical, or Diels-Alder reaction forming covalent bonds with the bottom and top low-k dielectrics.

Following the application of the buried etch stop layer to the bottom low-k dielectric, a hot plate bake is typically employed to remove residual solvent and partially crosslink the etch stop layer rendering it insoluble prior to forming the top spun-on dielectric thereon. Typically, in the present invention, the buried etch stop layer is made with solution having about 1.0 to about 10 wt. % solids content.

In accordance with the present invention, the bottom spun-on dielectric layer of the multilayer of spun-dielectrics has a thickness of from about 500 to about 10,000 Å, with a thickness of from about 900 to about 3000 Å being more preferred. The buried etch stop layer of the inventive multilayer of spun-on dielectrics typically has a thickness of from about 25 to about 1500 Å, with a thickness of from about 100 to about 300 Å being more preferred. Insofar as the top spun-on dielectric is concerned, that layer typically has a thickness of from about 500 to about 10,000 Å, with a thickness of from about 1000 to about 3000 Å being more preferred.

The multilayer of spun-on dielectrics containing top and bottom spun-on dielectrics as well as the organosilane buried etch stop layer may be cured now, or if the hard mask is made from spun-on dielectrics, the multilayer of spun-on dielectrics and hard mask may be cured in a single curing step. The later is preferred since it reduces the number of processing steps in the overall procedure. The curing conditions mentioned hereinbelow also apply to the embodiment wherein curing occurs prior to formation of the hard mask.

Figure 1B:
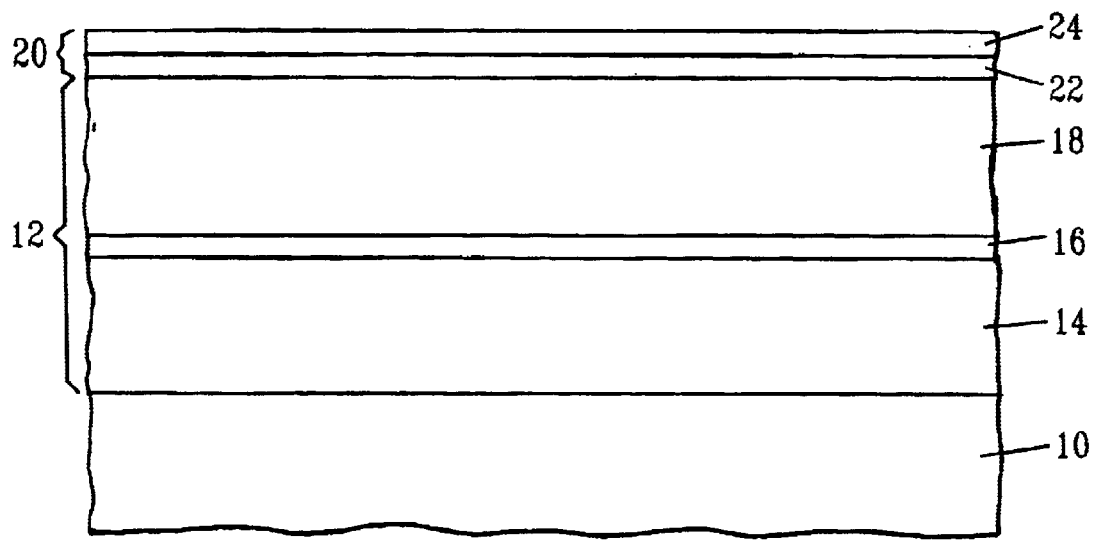

After forming the structure shown in FIG. 1A, hard mask 20 is formed on the uppermost surface of the multilayer of spun-on dielectrics, i.e., on top spun-on dielectric 18. In accordance with the present invention, hard mask 20 includes at least polish stop layer 22 and patterning layer 24. The hard mask, which is shown in FIG. 1B, may be formed by conventional PECVD processes, or more preferably, each layer of hard mask 20 is formed by spin-on coating. Layers formed by spin-on coating are preferred since they reduce the number of deposition tools used in the overall process; therefore reducing the overall manufacturing cost. Moreover, although the drawings depict the presence of two layers in the hard mask, the hard mask may contain more than two layers.

The materials used in forming the hard mask may vary and are dependent upon their etch selectivity towards the layer that lies directly underneath. For example, the patterning layer employed in the present invention is a material that has high-etch selectivity (about 10:1 or greater) towards the underlying polish stop layer. The polish stop layer, on the other hand, is a material that has high-etch selectivity towards the underlying top spun-on dielectric and it should have a dielectric constant that does not significantly increase the effective dielectric constant of the multilayer of spun-on low-k dielectrics.

Accordingly, the patterning layer may include organic or inorganic dielectrics, while the polish stop layer may comprise inorganic or organic dielectrics. The exact nature of each layer will be dependent first upon the top spun-on low-k dielectric layer and then upon the polish stop layer. For example, if the top spun-on dielectric is an organic dielectric, then the etch stop layer is typically an inorganic dielectric and the patterning layer is typically formed of an organic dielectric layer. The thickness of each layer of the hard mask may vary and is not critical to the present invention. Typically, however, the patterning layer has a thickness of from about 100 to about 3000 Å, and the polish stop layer has a thickness of from about 100 to about 1000 Å.

Following formation of the hard mask, the hard mask, i.e., polish stop and patterning layers, as well as the underlying multilayer of spun-on dielectrics may be subjected to a single curing step which is carried out using conventional conditions well known to those skilled in the art. The single curing step occurs if all the dielectrics are made from spun-on dielectrics. The curing step may include a hot plate bake step or furnace heating. In the present invention, it is preferred to use a curing step that includes furnace baking. Although the conditions for curing may vary, typically, hot plate baking is carried out at temperature of from about 250° to about 500° C. for a time period of from about 30 to about 500 seconds, while the furnace baking step is carried out at a temperature of from about 200° to about 500° C. for a time period of from about 15 minutes to about 3.0 hours. It is again emphasized that if the hard mask is not composed of spun-on dielectrics, then curing may occur prior to hard mask deposition. Moreover, since a spun-on hard mask is preferred, the drawings and following description are specific for that embodiment. It is noted however that the drawings and following description are valid for hard masks that are not spun-on coated.

Figure 1C:
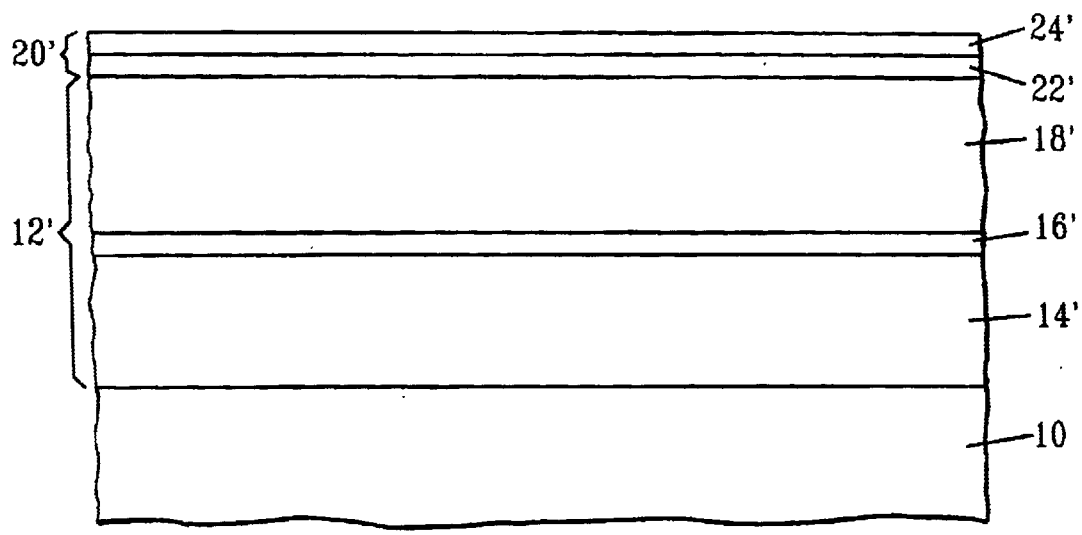
Figure 1D:
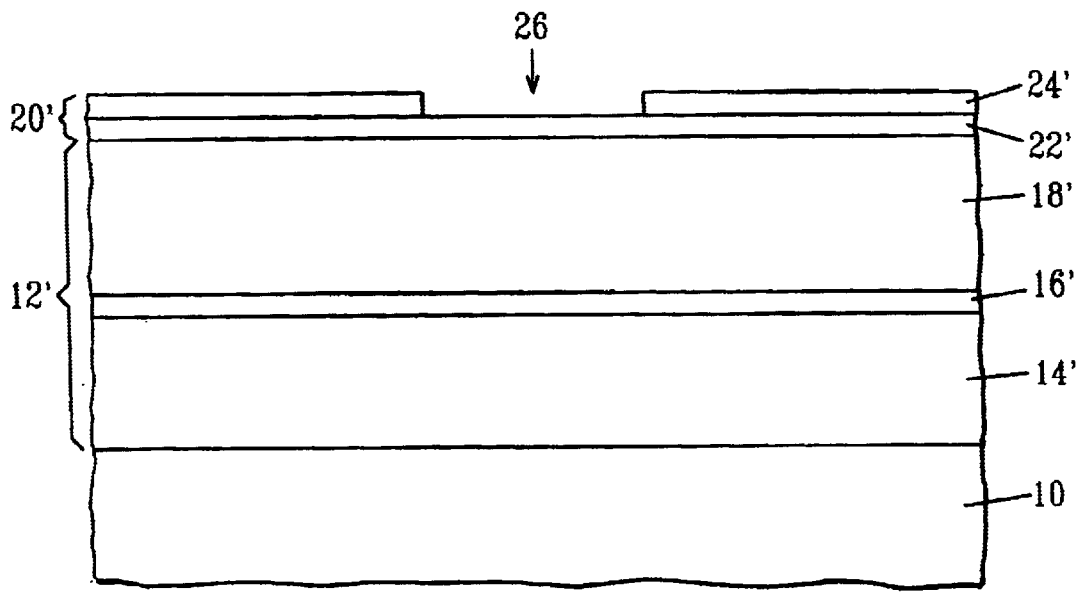

The cured layers are shown in FIG. 1C and are labeled as cured multilayer of spun-on dielectrics 12' including cured top spun-on dielectric 18', cured buried etch stop layer 16', and cured bottom spun-on dielectric 14', and cured hard mask 20' including cured polish stop layer 22' and cured patterning layer 24'. It is noted that during the curing step, the buried etch stop layer forms covalent bonds to the bottom and top spun-on low-k dielectrics. Following curing of the multilayer of spun-on dielectrics and optionally the hard mask, the structure shown in FIG. 1C is then subjected to a first lithography and etching process which forms opening 26 in cured patterning layer 24'; See FIG. 1D. Specifically, the structure shown in FIG 1D is formed as follows: First, a photoresist (not shown in the drawings) used for patterning the patterning layer is formed on the cured patterning layer using conventional deposition processes well known to those skilled in the art. The photoresist is then exposed to a pattern of radiation and thereafter the pattern is developed in the photoresist using conventional resist developers.

After developing the resist pattern, opening 26 is formed in the hard mask so as to expose a portion of the underlying polish stop layer. Specifically, the opening is formed by a conventional dry etching process including, but not limited to: reactive-ion etching (RIE), plasma etching and ion beam etching. Of these various dry etching processes, it is preferred to use RIE that includes fluorine-based chemistries. After this etching step, the patterned photoresist is stripped from the structure utilizing conventional stripping processes well known to those skilled in the art. The resultant structure obtained from the first lithography and etching step is shown in FIG. 1D.

Figure 1E:
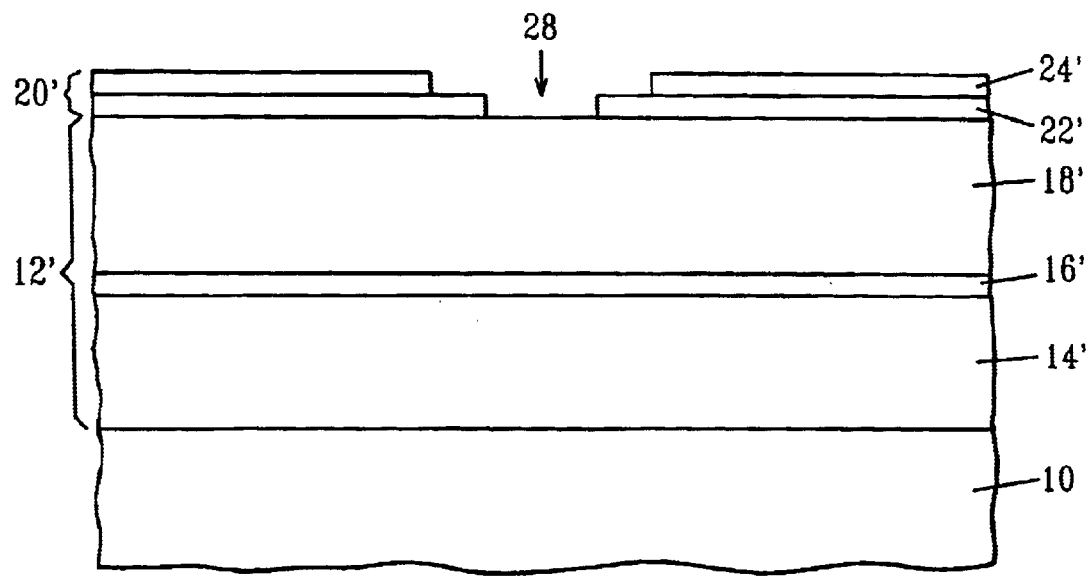

After stripping the photoresist from the structure, a new photoresist (not shown) is applied to the structure shown in FIG. 1D. The new photoresist is then subjected to lithography and etching so as to provide second opening 28 in the structure which exposes a surface of cured multilayer of spun-on dielectrics 12'. The second etching step includes one of the aforementioned dry etching processes. Of these various dry etching processes, it is preferred to use RIE that includes fluorine-based chemistries. Following the second etch which exposes the cured multilayer of spun-on dielectrics, the second photoresist is stripped from the structure utilizing a conventional stripping process providing a structure such as shown in FIG. 1E.

Figure 1F:
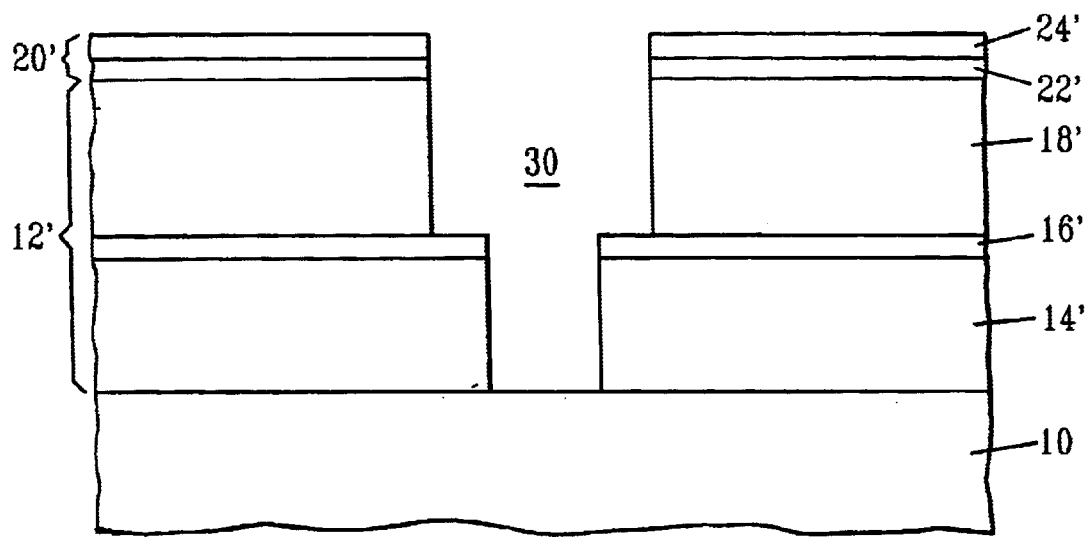

FIG. 1F shows the structure after the pattern formed in the hard mask is transferred to the multilayer of spun-on dielectrics. Specifically, the pattern transfer, which forms trench 30 in the multilayer of spun-on dielectrics, is carried out using a dry etching process that includes oxygen or reducing chemistry. In accordance with the present invention, trench 30 may be a via or line or both.

Figure 1G:
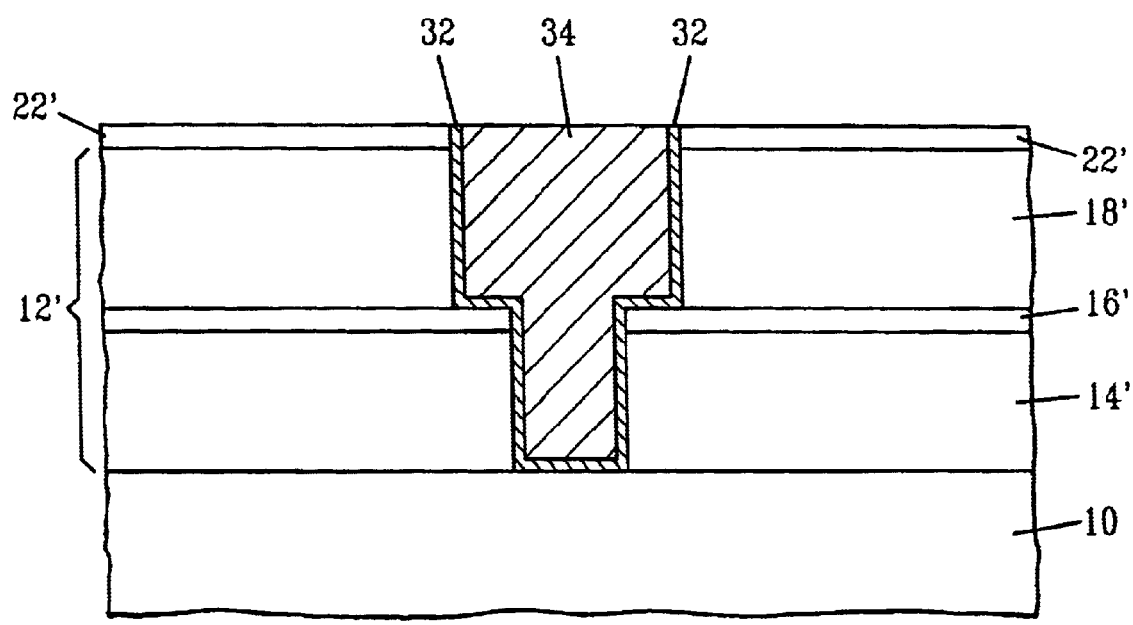

Following the pattern transfer to the multilayer of spun-on dielectrics, the trench is then filled with a conductive metal 34 and planarized so as to provide the structure shown in FIG. 1G. An optional, but preferable liner material 32 may be formed in the trench prior to filling with the conductive metal. The term "conductive metal" is used herein to denote a metal selected from the group consisting of aluminum (Al), copper (Cu), tungsten (W), silver (Ag) and other like metals which are typically used in interconnect structures. Alloys of these conductive metals such as Al—Cu are also contemplated herein. A preferred metal used in the present invention is copper. The metal is formed in the trench utilizing a conventional deposition process such as chemical vapor deposition (CVD), plasma-assisted CVD, plating, sputtering, chemical solution deposition and other like deposition processes.

The optional liner material employed in the present invention includes any material which would prevent the diffusion of the conductive metal into the dielectric layers. Some examples of such liners include, but are not limited to: TiN, TaN, Ti, Ta, W, WN, Cr, Nb and other like materials including combinations thereof. The liner material may be formed in the trench utilizing conventional deposition processes well known to those skilled in the art, including: CVD, plasma-assisted CVD, sputtering, plating and chemical solution deposition.

After filling the trench with a conductive metal, the structure is subjected to a conventional planarization process such as chemical-mechanical polishing (CMP) which removes any conductive metal above the polish stop layer. Note that the planarization step also removes the patterning layer of the hard mask, but not the polish stop layer from the structure. Instead, the polish stop layer remains on the surface of the structure. Because of this reason, it is essential to choose a polish stop layer that has a dielectric constant that is relatively-low so as to not increase the effective dielectric constant of the interconnect structure.

Following the processing steps of the present invention additional via and wiring levels may be formed over the structure shown in FIG. 1F by repeating the processing steps of the present invention. Thus, the inventive method can be used to prepare interconnect structures that include one or more wiring and via levels present therein.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. An interconnect structure comprising:
   a substrate having a patterned multilayer of spun-on dielectrics formed on a surface thereof, said patterned multilayer of spin-on dielectrics comprising an inorganic or organic bottom low-k dielectric, a buried etch stop layer, and a top low-k dielectric that is organic and porous, wherein said buried etch stop layer comprises a spun-on organosilane which is covalently bonded to said top and bottom low-k dielectric;
   a polish stop layer formed on said patterned multilayer of spun-on dielectrics; and
   metal conductive regions formed within said patterned multilayer of spun-on dielectrics.

2. The interconnect structure of claim 1 wherein said top low-k dielectric comprises an C, O and H.

3. The interconnect structure of claim 2 wherein said top low-k dielectric is an aromatic thermosetting polymeric material.

4. The interconnect structure of claim 1 wherein said bottom low-k inorganic dielectric includes Si, O and H, and optionally C.

5. The interconnect structure of claim 4 wherein said bottom low-k dielectric is HOSP, MSQ, TEOS, HSQ, MSQ-HSQ copolymers, organosilanes or any other Si-containing material.

6. The interconnect structure of claim 1 wherein said bottom and top low-k dielectrics are both composed of organic dielectric materials.

7. The interconnect structure of claim 1 wherein said bottom low-k dielectric is porous.

8. The interconnect structure of claim 1 wherein said spun-on organosilane has the formula:

$$X-\underset{\underset{R_b^2}{|}}{\overset{\overset{R_a^1}{|}}{Si}}-(OR^3)_y$$

wherein X is a polymerizable group capable of undergoing a Diels-Alder reaction or a free radical reaction and is selected from alkenes, norborenylenes, vinyl and alkynes; $R^1$ and $R^2$ are the same or different and are H, alkyl, alkoxy, alkylester, alkenyl, alkynyl, aryl, or cycloalkyl; $R^3$ is alkyl or a $-C(O)R_4$ radical wherein $R^4$ is alkyl; a and b are the same or different and are 0, 1 or 2, and y is from 1–3, with the proviso that the sum of a+b+y is 3.

9. The interconnect structure of claim 8 wherein said spun-on organosilane is vinyltrialkoxysilane, allyltrialkoxysilane, vinyldiphenylalkoxysilane, norborenyltrialkoxysilane, or trivinyltrialkoxysilane.

10. The interconnect structure of claim 9 wherein said spun-on organosilane is vinyltriacetoxysilane, vinyltrimethoxysilane, vinyltriethoxysilane, allyltrimethoxysilane, vinyldiphenylethoxysilane, norborenyltriethoxysilane or trivinyltriethoxysilane.

11. The interconnect structure of claim 1 wherein said polish stop layer is comprised of a low-k spun-on inorganic or organic dielectric.

12. The interconnect structure of claim 1 wherein said substrate is a dielectric, an adhesion promoter, a semiconductor wafer or any combination thereof.

13. The interconnect structure of claim 1 wherein said metal conductive regions include at least a conductive metal selected from the group consisting of Al, W, Cu, Ag and alloys thereof.

14. The interconnect structure of claim 13 wherein said conductive metal is Cu.

15. The interconnect structure of claim 1 wherein said metal conductive regions further include a liner material.

16. The interconnect structure of claim 15 wherein said liner material is selected from the group consisting of TaN, TiN, Ta, Ti, W, WN, Cr, Nb and combinations thereof.

17. The interconnect structure of claim 1 wherein said metal conductive regions include vias, lines or combinations thereof.

18. A multilayer of spun-on dielectrics for use in forming interconnect structure, said multilayer of spun-on dielectrics comprising an inorganic or organic bottom low-k dielectric, a buried etch stop layer, and a top low-k dielectric that is organic and porous, wherein said buried etch stop layer comprises a spun-on organosilane which is covalently bonded to said top and bottom low-k dielectrics.

* * * * *

UNITED STATES PATENT AND TRADEMARK OFFICE
CERTIFICATE OF CORRECTION

PATENT NO.   : 6,710,450 B2
DATED        : March 23, 2004
INVENTOR(S)  : Stephen M. Gates et al.

It is certified that error appears in the above-identified patent and that said Letters Patent is hereby corrected as shown below:

<u>Column 6,</u>
Lines 10 and 13, "$R_a^1$" and "$R_b^2$" should read -- $R^1_a$ -- and -- $R^2_b$ --

<u>Column 9,</u>
Line 51, delete "an"
Line 56, delete "inorganic"

<u>Column 10,</u>
Lines 10 and 13, "$R_a^1$" and "$R_b^2$" should read -- $R^1_a$ -- and -- $R^2_b$ --
Line 20, "$C(O)R_4$" should read -- $C(O)R^4$ --

Signed and Sealed this

Fifteenth Day of February, 2005

JON W. DUDAS
*Director of the United States Patent and Trademark Office*